United States Patent [19]

Williamson, Jr.

[11] Patent Number: 4,779,041
[45] Date of Patent: Oct. 18, 1988

[54] INTEGRATED CIRCUIT TRANSFER TEST DEVICE SYSTEM

[75] Inventor: Eddie L. Williamson, Jr., Fort Collins, Colo.

[73] Assignee: Hewlett-Packard Company, Palo Alto, Calif.

[21] Appl. No.: 52,528

[22] Filed: May 20, 1987

[51] Int. Cl.[4] .................... G01R 31/04; G01R 31/02
[52] U.S. Cl. .................... 324/73 PC; 324/73 R; 324/158 R
[58] Field of Search ............ 340/150, 652, 653; 324/73 AT, 73 PC, 73 R, 158 R, 158 D, 158 T, 537, 525; 371/15; 364/550

[56] References Cited

U.S. PATENT DOCUMENTS

| | | | |
|---|---|---|---|
| 3,969,670 | 7/1976 | Wu | 324/73 PC |
| 4,595,875 | 6/1986 | Chan et al. | 324/73 PC |
| 4,638,243 | 1/1987 | Chan | 324/73 PC |
| 4,670,708 | 6/1987 | Boszyak et al. | 324/73 PC |
| 4,697,139 | 9/1987 | Gal | 324/73 R |
| 4,727,317 | 2/1988 | Oliver | 324/158 R |

FOREIGN PATENT DOCUMENTS

| | | | |
|---|---|---|---|
| 2038490 | 7/1980 | United Kingdom | 324/537 |
| 2167196 | 5/1986 | United Kingdom | 324/73 PC |

OTHER PUBLICATIONS

"Load-Driver Error Isolation", by Arter et al, IBM Tech. Disc. Bull., vol. 21, #6, 11/78, pp. 2243-2244.

Primary Examiner—Reinhard J. Eisenzopf
Assistant Examiner—W. Burns
Attorney, Agent, or Firm—William W. Cochran

[57] ABSTRACT

The system is for testing semiconductor components such as TTL components and CMOS components to determine whether the input, output and ground pins are conductively connected to a circuit, such as the circuit of a printed circuit board, and whether proper conductive paths exist between the connector pins and the ground pin through the semiconductor. This is accomplished by providing a current pulse on one terminal to generate a voltage drop across an inherent resistance of the component which is connected in series with the other terminal of the component and detecting the resulting voltage drop. The existence of the voltage drop indicates that both the input and output terminals, as well as the ground terminal, are properly connected to the printed circuit board.

10 Claims, 2 Drawing Sheets

INTEGRATED CIRCUIT TRANSFER TEST DEVICE SYSTEM

BACKGROUND

A. Field of Invention

The present invention pertains generally to measuring and testing devices and more particularly to in-circuit test devices for testing digital components.

B. Description of the Background

Quality control of manufacturing and production require implementation of systems for testing electronic components after they have been physically soldered onto printed circuit boards.

Several different approaches have been used for testing components. For example, functional testing uses a procedure of applying predetermined input signals and monitoring the output of the printed circuit board to determine if all of the components are present and operating properly. Although funtional testing provides an excellent way of determining, as an end result, whether the PC board is functioning properly, it provides little or no information with regard to analysis of the functioning of individual components on the board. Complex programming techniques have been used to provide limited information as to the location of non-functioning components on the board by carefully selecting input data and analyzing the output data. Such systems are complex, often costly to implement and normally provide vague information as to the location of malfunctioning components.

Because of the limitations of functional testing, in circuit testing techniques have been used that individually test the components on the board to determine if they are working properly. In this manner, non-functioning components can be readily identified and replaced to prevent the entire circuit board from being scrapped.

Another class of testing devices that provides simpler tests and is less expensive to implement are the manufacturing defect analyzers which are designed to locate manufacturing faults such as shorts on a PC board, missing IC's, bent component pins, etc. Although these devices do a reasonable job of finding shorts and gross analog faults, they are marginal when testing digital sections of the board. Hence, a need exists for a device which is capable of performing the functions of a manufacturing defects analyzer to determine if a digital component is present and properly connected to the circuit. It is also desirable to provide, in conjunction with such a test, a method of providing transfer tests of the digital components.

SUMMARY OF THE INVENTION

The present invention overcomes the disadvantages and limitations of prior art by providing a system and method for determining whether digital components are present and properly connected to a printed circuit board. The present invention determines whether input and output connector pins, as well as a ground pin for transistor to transistor logic (TTL) components and metal oxide semiconductor (MOS) components are conductively connected to a circuit on a printed circuit board, and whether proper conductive paths exist between the connector pins and the ground pin through the semiconductor.

In accordance with the present invention, a biasing current source applies a biasing current to either the input or output of a TTL circuit and the input of a CMOS circuit to forward bias a diode junction existing between that lead and a ground lead of the digital component. A second current source applies a test current, usually in the form of a large current pulse, to the other lead of the digital component, i.e. either the input or output lead of a TTL component, or the output of a CMOS component, which causes a voltage drop across an inherent resistance of the digital component that is in series with both the input and output lead of the digital component. This causes a voltage drop on the biased lead indicating that the digital component is properly connected to the circuit and proper conductive paths exist between the connector pins and ground pin of the digital component.

The advantage of the present system is that it provides a simple and inexpensive system equivalent to a manufacturing defects analyzer for digital components such as TTL and CMOS components and additionally performs transfer tests to determine if proper conductivity exists through these digital components. Hence, the present invention not only performs the function of manufacturing defect analyzers on digital components, it additionally provides limited transfer testing of the component in a simple and inexpensive manner equivalent to manufacturing defect analyzers.

DETAILED DESCRIPTION OF THE DRAWINGS

An illustrative and presently preferred embodiment of the invention is shown in the accompanying drawings, wherein:

FIG. 1 comprises a schematic overall view of an implementation of the device of the present invention.

DETAILED DESCRIPTION OF THE PRESENT INVENTION

Figure 1:
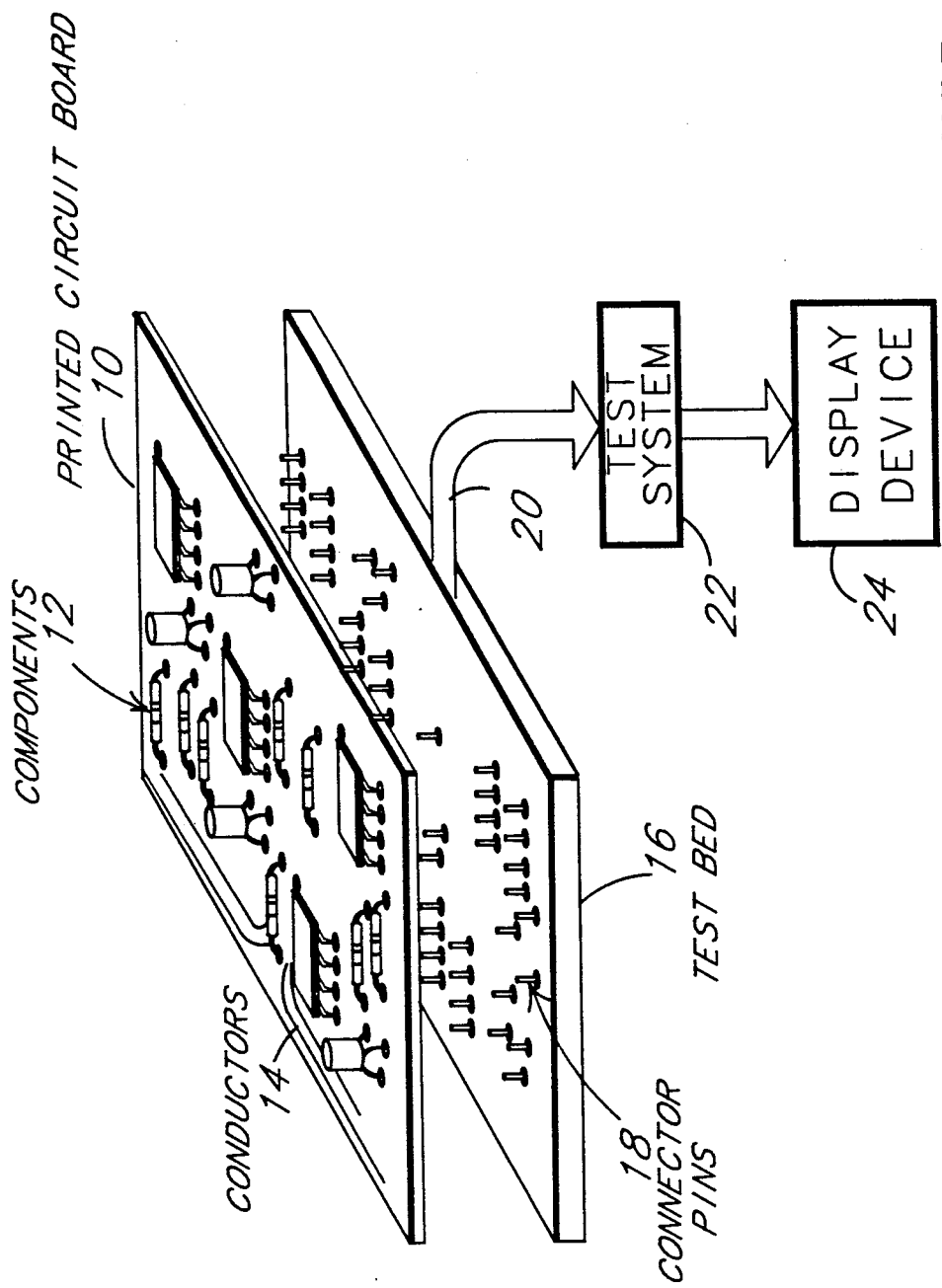

Printed circuit board 10 has a plurality of both analog and digital components 12 connected by way of the component leads through a plurality of conductors 14 that form a circuit on the printed circuit board 10. Test bed 16 has a plurality of connector pins 18 that function to contact conductors 14 at predetermined locations to apply test signals and detect responses at predetermined locations within printed circuit board 10. Conductors 20 connect the connector pins 18 to test system 22. Test system 22 includes the necessary signal generators and signal processing equipment to perform the operations and analysis of the present invention and provide a display for display device 24 which indicate any defects that may exist in the circuit of printed circuit board 10.

Figure 2:
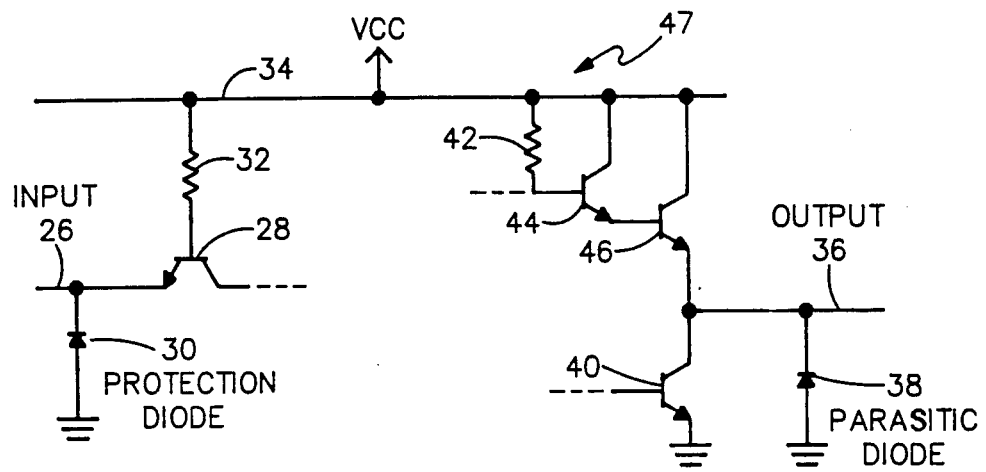
FIG. 2 is a partial schematic illustration of a typical TTL circuit.

FIG. 2 schematically illustrates a portion of a typical transistor to transistor logic (TTL) circuit which comprises a digital component that is used frequently in many circuits. The circuit illustrated in FIG. 2 can be implemented in TTL or metal oxide semiconductors (MOS) components such as complimentary metal oxide semiconductors (CMOS). Although the circuit illustrated in FIG. 2 may be implemented slightly differently in CMOS circuitry and may function slightly differently, the overall configuration and overall functional capabilities are generally similar to TTL implementation. Hence, the present invention may be implemented with slight variations for use with CMOS components, as set forth below.

FIG. 2 is a partial schematic diagram illustrating the components of interest in the present invention. The input 26 of the TTL circuit of FIG. 2 is connected to transistor 28 and protection diode 30. Resistor 32 is coupled to $V_{CC}$ input 34 and the base lead of transistor 28. Output 36 is coupled to a parasitic diode which is inherently formed between the silicon and the substrate of the TTL device. Output 36 is also coupled to the collector lead of transistor 40 which appears as an open circuit when current is drawn through output 36 until the base lead of transistor 40 is biased on. Resistor 42 is coupled between the $V_{CC}$ lead 34 and the base of transistor 44. The emitter lead of transistor 44 is coupled to the base of transistor 46. The emitter lead of transistor 46 is coupled to the output 36.

Figure 3:
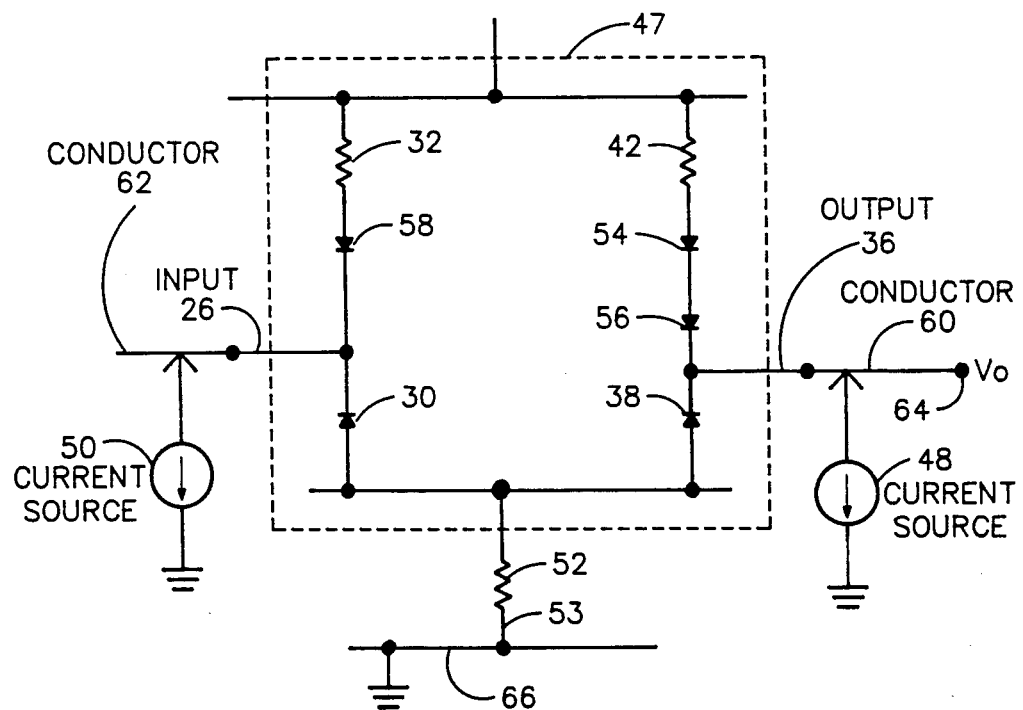
FIG. 3 illustrates the implementation of the present invention with a simplified schematic illustration of the TTL circuit illustrated in FIG. 2.

The TTL semiconductor component set forth in FIG. 2 is schematically illustrated as the semiconductor circuit 47 of FIG. 3. FIG. 3 is a schematic illustration which indicates the manner in which the present invention is implemented with a circuit such as disclosed in FIG. 2. As shown in FIG. 3, a first current source 48 is connected to output 36 of the TTL circuit and a second current source 50 is connected to input 26 of the TTL circuit. In implementing the present invention with TTL circuits, the current sources 48 and 50 can be connected as shown, or in the reverse manner, i.e. with current source 48 coupled to the input 26 and current source 50 coupled to the output 36, to achieve equally successful results. In other words, the input and output of the circuit need not be distinguished to perform the present invention, which further adds to the simplicity and ease of implementation of the present invention. Referring again to FIG. 3, inherent resistance 52 comprises a distributed resistance resulting from the ground bond wire pin of the semiconductor component, as well as metalization and substrate resistances that are present on the semiconductor chip. Both the parasitic diode 38 and the protection diode 30 are connected in series with the inherent resistance 52. Diodes 54 and 56 represent the base/emitter junctions of transistors 44 and 46, respectively. Resistor 42 is coupled in series with the base/emitter junction 54 to $V_{CC}$. Similarly, diode 58 comprises the base/emitter junction of transistor 28 which is connected in series with resistor 32 to $V_{CC}$. Output 36 is designed to be conductively connected to conductor 60 comprising one of the conductors 14 (FIG. 1) on printed circuit board 10. Similarly, conductor 62 comprises one of conductors 14 (FIG. 1) which is conductively connected to input 26 of the semiconductor component 47 and conductor 66 comprises the ground conductor of conductors 14 (FIG. 1) which is conductively connected to the ground pin 53 of semiconductor component 47.

In operation, current source 48 produces a biasing current which forward biases the parasitic diode 38 causing a current to flow through inherent resistance 52 whenever conductor 60 is conductively connected to output 36. Since the biasing current produced by current source 48 is minimally sufficient to forward bias parasitic diode 38, a readily detectable voltage drop ($V_0$) at node 64 is not detectable due to the fact that the inherent resistance 52 is very small. Current source 50 produces a large current pulse which forward biases protection diode 30 and draws a large current through inherent resistance 52 whenever conductor 62 is conductively connected to input 26. Since current source 50 produces a large current pulse, a voltage drop across resistance 52 is detectable at node 64 due to the fact that inherent resistance 52 is connected in series with both input 26 and output 36, as shown in FIG. 3. Hence, the generation of a voltage drop at node 64 occurs when conductor 62 is conductively connected to input 26, the ground connector pin is conductively connected to ground conductor 66, and conductor 60 is conductively connected to output 36. In this manner, the simple and easy transfer tests can be performed on the semiconductor component to determine if input, output, and ground pins are properly connected to the circuit and the proper conductive paths exist through the semiconductor component.

Occassionally, parallel conductive paths exist in certain circuit topologies which can result in improper test responses. Whenever this occurs, conventional guarding techniques can be used to ground parallel conductive paths and ensure that changes in output voltage ($V_0$) at node 64 occur as a result of changes in current flowing through inherent resistance 52.

The present invention therefore provides a simple test system which can be easily implemented in the manner of a manufacturing defects test analyzer to determine if the input, outut and ground pins of a TTL and CMOS semiconductor component are properly connected to a circuit of a printed circuit board, as well as also providing a limited functional test of a component by determining if proper conductive paths exist within the semiconductor component. Testing techniques of the present invention greatly enhance standard manufacturing defects analyzers which provide limited capabilities for testing digital components in a circuit. Present invention not only is capable of testing digital components to supplement manufacturing defects analyzers but is also capable of providing transfer testing of the digital component.

The foregoing description of the invention has been presented for purposes of illustration and description. It is not intended to be exhaustive or to limit the invention to precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

I claim:

1. A system for testing a semiconductor component to determine whether input and output connector pins and a ground pin of said semiconductor component are conductively connected to a circuit and whether proper conductive paths exist between said connector pins and said ground pin through said semiconductor comprising:

first current source means for generating a biasing current sufficient to activate a diode junction between said input connector pin and said ground pin;

first conductor means for forming a conductive path from said first current source means to a point on said circuit which is designed to be conductively coupled to said input connector pin;

second current source means for generating a testing current that is sufficient to cause a voltage drop on said first conductor means in response to said testing current flowing through a common inherent resistance of said semiconductor component that is connected in series from said ground pin to both said input and output connector pins;

second conductor means for forming a conductive path from said second current source means to a point on said circuit which is designed to be conductively coupled to said output connector pin;

third conductor means for forming a conductive path from ground potential in said circuit to said ground pin;

detector means for measuring said voltage drop whenever said first conductor means is conductively connected to said input connector pin, said second conductor means is conductively connected to said output connector pin and said third conductor means is conductively connected to said ground pin indicating that said input and output connector pins and said ground pin are conductively connected to said circuit and that proper conductive paths exist between said connector pins and said ground pin through said semiconductor component.

2. The system of claim 1 wherein said semiconductor component comprises a transistor to transistor logic (TTL) device.

3. The system of claim 1 wherein said semiconductor component comprises a metal oxide semiconductor device.

4. The system of claim 1 further comprising:
guarding means for eliminating conductive paths between said first conductor and said second conductor.

5. A system for testing a semiconductor component to determine whether input and output connector pins and ground pin of said semiconductor component are conductively connected to a circuit and whether proper conductive paths exist between said connector pins and said ground pin through said semicondcutor comprising:

first current source means for generating a biasing current sufficient to activate a diode junction between said output connector pin and said ground pin;

first conductor means for forming a conductive path from said first current source means to a point on said circuit which is designed to be conductively coupled to said output connector pin;

second current source means for generating a testing current that is sufficient to cause a voltage drop on said first conductor means in response to said testing current flowing through a common inherent resistance of said semiconductor component that is connected in series from said ground pin to both said input and output connector pins;

second conductor means for forming a conductive path from said second current source means to a point on said circuit which is designed to be conductively coupled to said input connector pin;

third conductor means for forming a conductive path from ground potential in said circuit to said ground pin;

detector means for measuring said voltage drop whenever said first conductor means is conductively connected to said output connector pin, said second conductor means is conductively connected to said input connector pin and said third conductor means is conductively connected to said ground pin indicating that said input and output connector pins and said ground pin are conductively connected to said circuit and that proper conductive paths exist between said connector pins and said ground pin through said semiconductor component.

6. The system of claim 5 further comprising:
guarding means for eliminating conductive paths between said first conductor and said second conductor.

7. A method of testing a semiconductor component to determine whether input and output connector pins and a ground pin of said semiconductor component are conductively connected to a circuit and whether proper conductive paths exist between said connector pins and said ground pin through said semiconductor comprising the steps of:

applying a biasing current to a first conductor of said circuit which is coupled to an input lead of said digital component that is sufficient to forward bias a diode junction that exists between said input lead and a ground lead of said semiconductor component;

applying a testing current to a second conductor of said circuit which is coupled to an output lead of said semiconductor component that is sufficient to cause a detectable voltage drop between a third conductor which is coupled to said ground lead and said first conductor, said detectable voltage drop resulting from said testing current flowing through an inherent resistance of said digital component that is connected in series to both said first and second leads.

8. The method of claim 7 further comprising the step of:
guarding parallel conductive paths between said first conductor and said second conductor by grounding said parallel conductive paths to ensure that said voltage drop on said first conductor results from said testing current flowing through said inherent resistance.

9. A method of testing a semiconductor component to determine whether input and output connector pins and a ground pin of said semiconductor component are conductively connected to a circuit and whether proper conductive paths exist between said connector pins and said ground pin through said semiconductor comprising the steps of:

applying a biasing current to a first conductor of said circuit which is coupled to an output lead of said digital component that is sufficient to forward bias a diode junction that exists between said first lead output and a ground lead of said semiconductor;

applying a testing current to a second conductor of said circuit which is coupled to an input lead of said semiconductor that is sufficient to cause a detectable voltage drop between a third conductor which is coupled to said ground lead and said first conductor, said detectable voltage drop resulting from said testing current flowing through an inherent resistance of said digital component that is connected in series to both said first and second leads.

10. The method of claim 9 further comprising the step of:
guarding parallel conductive paths between said first conductor and said second conductor by grounding said parallel conductive paths to ensure that said voltage drop on said first conductor results from said testing current flowing through said inherent resistance.

* * * * *